United States Patent [19]

Meckel et al.

[11] 4,322,276

[45] Mar. 30, 1982

[54] METHOD FOR PRODUCING AN INHOMOGENEOUS FILM FOR SELECTIVE REFLECTION/TRANSMISSION OF SOLAR RADIATION

[75] Inventors: Nathan K. Meckel, La Mesa; Benjamin B. Meckel, Del Mar, both of Calif.

[73] Assignee: Deposition Technology, Inc., San Diego, Calif.

[21] Appl. No.: 50,484

[22] Filed: Jun. 20, 1979

[51] Int. Cl.³ .............................................. C23C 15/00
[52] U.S. Cl. .......................... 204/192 P; 204/192 R; 350/164; 428/472
[58] Field of Search ............... 204/192 R, 192 P, 298; 428/472

[56] References Cited

U.S. PATENT DOCUMENTS

| 2,799,600 | 7/1957 | Scott | 427/109 |
| 3,271,179 | 9/1966 | Smith, Jr. | 204/192 X |
| 3,793,167 | 2/1974 | Glaser | 204/298 |
| 3,945,903 | 3/1976 | Svendor | 204/192 |
| 3,962,062 | 6/1976 | Ingrey | 204/192 |
| 4,017,661 | 4/1977 | Gillery | 428/412 |
| 4,166,876 | 9/1979 | Chiba et al. | 428/215 |

OTHER PUBLICATIONS

R. Jacobson, Inhomogeneous and Coevaporated Homogeneous Films for Optical Applications, *Physics of Thin Films*, vol. 8, pp. 51-98.
A. Aronson and S. Weinig, Inline Production Magnetron Sputtering, *Vacuum*, vol. 27, No. 3, pp. 151-153.
Maissel and Glang, Handbook of Thin Film Technology, McGraw-Hill Book Co., New York, 1970, pp. 1-32 to 1-33; 3-24 to 3-25.
C. Misiano et al., "Co-sputtered Optical Film", *Vacuum*, vol. 27, No. 4, pp. 403-406.
E. L. Hollar et al., "Composite Film Metallizing for Ceramics", *J. Electrochem. Soc.*, vol. 117, No. 11 (Nov. 1970), pp. 1461-1462.

*Primary Examiner*—Delbert E. Gantz
*Assistant Examiner*—William Leader
*Attorney, Agent, or Firm*—Bruno J. Verbeck; Michael L. Slonecker

[57] ABSTRACT

A sputtered thin film coating characterized by a stepwise and/or variable refractive index as a function of film depth. By means of an in-line assembly of planar magnetrons, each magnetron essentially isolated from the others but for a region of sputtering overlap, select materials and combinations of said materials with reactive gases can be continuously deposited upon a dynamic substrate whereby to obtain pre-determined refractive index gradients. Substrates coated with an inhomogeneous thin film exhibit superior non-spectral reflective characteristics particularly desirable for architectural designs and applications.

5 Claims, 3 Drawing Figures

METHOD FOR PRODUCING AN INHOMOGENEOUS FILM FOR SELECTIVE REFLECTION/TRANSMISSION OF SOLAR RADIATION

BACKGROUND OF THE INVENTION

The application of thin films in optical interference coatings has been well established in optical technology for many years. The purpose of these vacuum deposited films was to provide thin films with accurately reproducible refractive indices and to control thicknesses. However, the main emphasis to date has been directed towards achieving films of uniform refractive indices. The primary reason for this is that all multi-layer films have been calculated on the use of homogeneous films, i.e., films with a constant index of refraction through each individual layer, and films which deviate from this homogeneity generate results which are almost impossible to analyze in detail, details which cause the desired multi-layered design to fail. If inhomogeneities are present in any one film having multi-layers, reproduction consistency is almost impossible to maintain.

It is the current practice of persons skilled in the art of large area solar energy transmissive/reflective coatings to utilize thin film coatings of one or more homogeneous layers, single layer coatings of aluminum based films predominating. Deposition is typically accomplished by vacuum evaporation of the film material onto a dynamic substrate. Such practice, however, has severe limitations. First, evaporation techniques are constrained by the vaporization temperature of the film material. As there is an effective upper limit of temperature at which vaporization can be employed, the practitioner is limited in the choice or selection of materials which can be used. Further, homogeneous thin films are characterized by spectral reflective properties occurring at the interface of dissimilar homogeneous layers. What results is the creation of an overall mirror-like appearance that detracts from use of such coatings in residential units and the like. While these spectral reflective characteristics can be minimized by reducing the refractive index of the film to a value closer to that of the substrate, this is achieved at the expense of an overall loss in the efficiency of the coating to screen out undesired heat producing wavelengths of radiant energy, i.e., infra-red radiation.

The concept of deliberately utilizing a varying index of refraction through a continuously prescribed formula has stimulated optical research over the last few years. See, for example, R. Jacobsson, "Inhomogeneous and Coevaporated Homogeneous Films for Optical Applications," Physics of Thin Films, Volume 8, pp. 51–98 (G. Hass, M. Francombe, R. Hoffman ed. 1975). Such an achievement would result in the design and production of an interference coating with optical properties superior to those of conventional multi-layer homogeneous thin films. However, recent attempts at the experimental attainment and control of inhomogeneous films have met with only limited success.

A promising method of inhomogeneous thin film construction involves the use of sputtering techniques to deposit select materials and combinations of said materials with reactive gases upon a substrate. A film layer deposited in the presence of an inert atmosphere comprising, for example, a predetermined partial pressure of argon results in the deposition upon the substrate of pure magnetron cathode material. By introducing a reactive gas, such as oxygen, during the sputtering process, i.e., reactive sputtering, said material chemically combines with the gas and produces the deposition of a material having a refractive index different from that of the cathode material. Control of reactive gas flow rate into the magnetron chamber permits the controlled variation of the refractive index throughout the film depth. See, for example, S. Ingrey, U.S. Pat. No. 3,962,062, disclosing a method for depositing an inhomogeneous film upon a stationary substrate by controllably varying the ratio of the flow rate of $O_2$ in relation to the flow rate of $N_2$ during the sputtering process of tantalum or niobium.

While recognizing that inhomogeneous thin films possess optical properties rendering them superior in particular applications to conventional homogeneous films, applicant is not aware of any method which has been devised to date whereby inhomogeneous films may be controllably deposited upon large surface area substrates.

SUMMARY OF THE INVENTION

The present invention relates to an apparatus and method for producing a large area solar screening device comprising an essentially transparent substrate upon which is coated an inhomogeneous thin film laminate. The product has, as unique characteristics, high transmissive efficiencies toward the visible light spectrum (4000 to 7000 Å), high reflectivity toward infrared (7000 Å and above), and a significant reduction in spectral reflection components associated with homogeneous laminate coatings. Briefly, the product of this invention results from the deposition of predetermined quantities of metals, dielectrics, cermets, or their combinations with reactive gases upon the surfaces of a transparent substrate as the substrate translates through isolated regions of reactive and non-reactive sputtering. In order that a smooth transition of refractive index is achieved as the substrate passes through the various sputtering regions, an overlap region is provided whereby the substrate may be simultaneously exposed to sputtering deposition from adjacent regions.

The apparatus utilized to effect inhomogeneous film deposition comprises a vacuum chamber within which sub-chambers serve to isolate a plurality of planar magnetrons from one another. The isolation of the magnetrons is essentially complete but for adjustable apertures between adjacent sub-chambers serving the dual function of permitting substrate travel therethrough in addition to permitting sputter deposition overlap. The planar magnetrons further are arranged in an in-line combination thereby to permit the accurate control of inhomogeneous film characteristics. This design, in conjunction with a dynamic means for moving the substrate material, permits the sputter deposition of select magnetron cathode target materials upon large surface area substrates in a dynamic manner and produces the smooth and/or stepwise transition of refractive index to variable values as a function of film depth.

The substrate may comprise any suitable transparent material such as glass, polymers, and the like. In an embodiment directed toward large area solar screening devices, the substrate beneficially comprises a coiled roll of polyester which can be easily and controllably translated through the apparatus. The magnetron target material may likewise be selected from a large group of materials including, for example, such metals as titanium, copper, gold, sliver, aluminum, nickel, chromium, molybdenum, vanadium, and stainless steel. Of course, it is to be understood that materials other than pure metals may be utilized to form the inhomogeneous laminate. For example, carbon disulfide, zinc sulfide, magnesium fluoride, sodium fluoride, and other materials from which cathode target material is constructed may be used. In selecting the appropriate materials, the primary objective is to match said materials whereby to form the desired refractive index gradient.

One embodiment of the product preferably has a first metallic oxide layer deposited upon a polyester substrate by reactive sputtering. We have found that the oxide layer exhibits superior adhesion to polyester substrates since the oxide tends to covalently bond with the substrate surface. The first coated substrate is then passed through a region of overlap wherein it is simultaneously exposed to reactive and non-reactive sputtering. Inasmuch as the rate of sputter deposition from a magnetron cathode decreases as the substrate is laterally displaced away from the cathode, a gradual phasing-out of oxide deposition occurs concurrently with a gradual phasing-in of pure metal depositon. Having passed through the overlap region, the substrate is then subjected to non-reactive sputtering wherein pure cathode target material is deposited thereon. The thus coated substrate again is passed through a second region of overlap and finally through a second region of reactive sputtering wherein oxide film is deposited forming the final layer of the coating laminate. The use of an oxide or highly inert metal is preferred for the final overlayment so that the coated product may be protected from exposure to corrosive environments.

Due to optical interference phenomenon associated with various metals, different colors may be obtained making the coated product particularly suitable for architectural applications in both commercial and residential units.

DESCRIPTION OF THE PREFERRED EMBODIMENT

Figure 1:
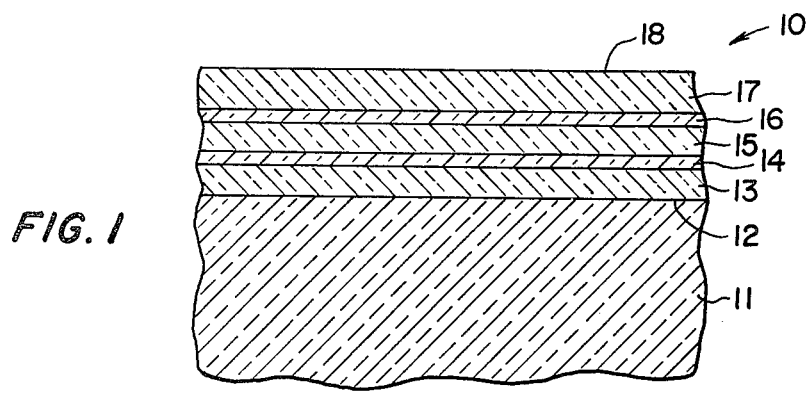
FIG. 1 is an enlarged cross-sectional view of a substrate upon which has been deposited an inhomogeneous thin film comprising metal and metallic oxide.

The present invention relates to a product having an inhomogeneous thin film coated upon an essentially transparent substrate, and to a process and apparatus for producing such product. With reference to FIG. 1, therein is shown an expanded cross-sectional view of an embodiment more fully illustrating the multiplicity of layers comprising our unique film coating. The coated product 10 comprises a transparent substrate 11, a first homogeneous layer 13, a first transition layer 14, a second homogeneous layer 15, a second transition layer 16, and a final homogeneous layer 17.

While substrate 11 may comprise glass, crystal, plastic, or the like, in a preferred embodiment the method of our invention utilizes polyester sheet material suitable for winding in coil form.

First homogeneous layer 13 comprises a metallic oxide deposited upon surface 12 of substrate 11 by reactive sputtering. The deposition of an oxide layer, rather than a pure metal layer, is preferred inasmuch as the oxide layer acts as a bonding layer wherein the shared electrons at the surface 12 and layer 13 interface result in covalent bonding, a bond much stronger than a metallic to organic surface bond. Further, polyester and most other like plastics are not impervious to oxygen and other destructive elements. Thus, metallic oxide, substantially more inert than pure metal, further serves to protect metallic layers within the laminate structure from environmental attack.

First transition layer 14 comprises an inhomogeneous layer characterized by a continuously varying index of refraction from a low value for the metallic oxide to a higher value associated with the pure metal. As will later be discussed more fully, the gradual phasing-out of metallic oxide and phasing-in of pure metal occurs in a region of overlap wherein substrate 11 is simultaneously exposed to both reactive and non-reactive sputtering.

Second homogeneous layer 15 preferably comprises a pure metal deposited upon layer 14 by the sputtering of magnetron target material in the presence of a non-reactive gas such as argon.

The product 10 of this invention is then completed by reversing the coating process and applying the remaining layers, second transition layer 16 and third homogeneous layer 17, in inverse order. Thus, layer 16 comprises a gradual phase-out of pure metal and phase-in of metallic oxide, and layer 17 comprises metallic oxide. The use of an oxide for layer 17 is preferred so that the pure metal within layer 15 is protected from environmental attack, and the abrasion resistance of the product 10 improved.

Figure 2:
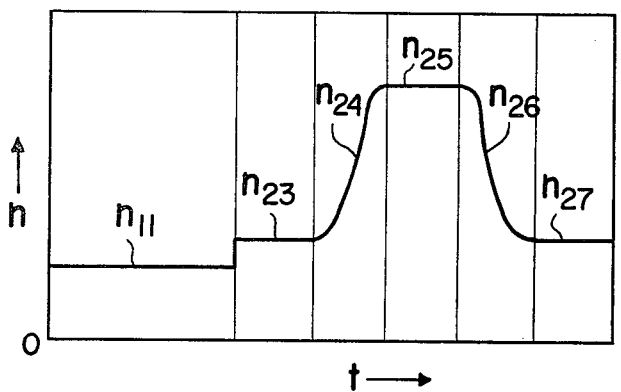
FIG. 2 graphically depicts the value of refractive index (n) as a function of film depth (t) wherein are displayed regions of continuously varying refractive index characteristic of inhomogeneous film coatings.

Referring to FIG. 2, it can be seen that indices of refraction $n_{23}$ and $n_{27}$ for the oxides forming homogeneous layers 13 and 17 respectively are lower than the refractive index $n_{25}$ of the pure metal comprising homogeneous layer 15. Further, the interposition between said homogeneous layers of inhomogeneous transition layers 14 and 16, characterized by variable refractive index gradients $n_{24}$ and $n_{26}$, permits the smooth transition of refractive index. This manner of refractive index variation results in the desired phased reflectance/transmission of selected solar radiation wavelengths while at the same time serving to reduce the spectral reflectivity characteristics of product 10.

Figure 3:
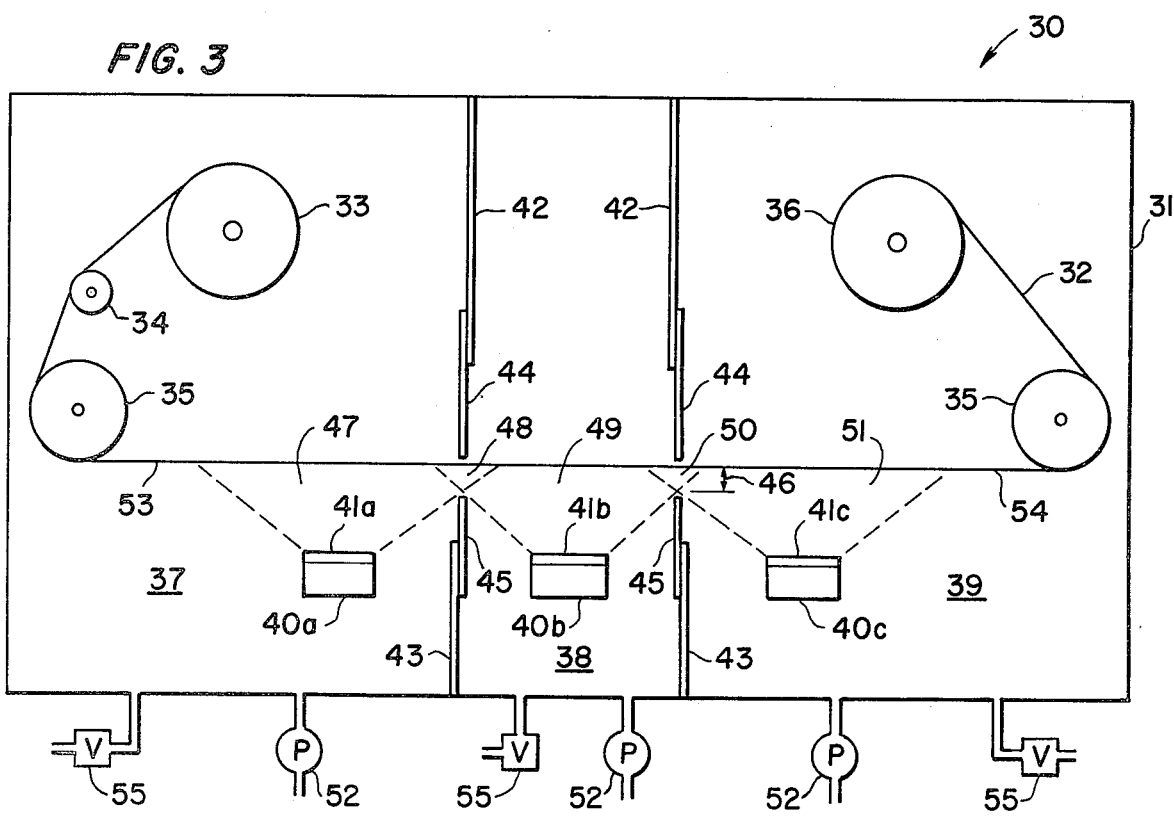
FIG. 3 is a diagrammatic representation of an apparatus suitable for practicing the method of our invention whereby an inhomogeneous thin film can be deposited upon a large area substrate.

Coming now to FIG. 3, therein is shown a diagrammatic cross-sectional view of an apparatus 30 by which the method of our invention can be practiced. More specifically, apparatus 30 comprises a vacuum chamber 31 further defined by sub-chambers 37, 38, and 39. Sub-chambers 37, 38, and 39 are essentially isolated from each other by means of fixed walls 42 and 43, said walls horizontally traversing the inner width of vacuum chamber 31.

Isolation between the sub-chambers is further ensured by means of adjustable plates 44 and 45, horizontally traversing the inner width of chamber 31, and secured to fixed walls 42 and 43 respectively by detachable bolts or the like. Said plates, or a suitable equivalent thereof, are vertically adjustable and define apertures 46 by which substrate 32 is permitted to pass through into each of said sub-chambers. Inasmuch as various combinations of materials may be used for cathodes 40a, 40b, and 40c, and substrate 32, plates 44 further permit the vertical adjustment of said substrate whereby to increase or decrease the mean free path between said cathodes and said substrate. Plates 45 are similarly adjustable, serving to controllably define the regions of overlap 48 and 50 wherein substrate 32 may be simultaneously exposed to sputter deposition from cathodes contained within adjacent sub-chambers. It can readily be seen that varying the widths of apertures 46 results in either increased or decreased regions of overlap 48 and 50.

Contained within sub-chambers 37, 38, and 39 are planar magnetron cathodes 40a, 40b, and 40c, each cathode further including thereon a target plate 41a, 41b, and 41c, respectively, comprising the material to be deposited upon substrate 32. The magnetrons are preferably positioned underneath substrate 32 whereby to prevent any solid impurities present within the sub-chambers from settling upon the surface of substrate 32 being coated. Still further, said cathodes and target plates are horizontally positioned perpendicular to the path of substrate travel whereby to ensure that the deposition of target material across the width of substrate 32 is of uniform thickness.

Apparatus 30 further comprises dynamic means whereby substrate 32 successively translates through sub-chambers 37, 38, and 39. More specifically, said dynamic means comprises a load reel 33 upon which an uncoated coil of substrate 32 material is secured, a tension roller 34, chill rolls 35 to reduce excessive heat rise within the substrate as it is coated, and a take-up reel 36. Chill rolls 35 are further vertically adjustable to permit the positioning of substrate 32 at predetermined distances from cathodes 40a, 40b, and 40c.

Finally, apparatus 30 is provided with means whereby select atmospheres of reactive and/or non-reactive gases can be created and maintained within each of sub-chambers 37, 38, and 39. As diagrammatically shown in FIG. 3, said means comprises vacuum pumps 52 and gas inlet valves 55 communicating through a wall of chamber 31 with the interior of each of said sub-chambers.

Initially, pumps 52 are utilized to evacuate chamber 31 to a predetermined low pressure prior to commencing sputtering operations. Thereafter, valves 55 introduce select partial pressures of reactive and/or non-reactive gases into each of said sub-chambers thereby to create predetermined sputtering atmospheres.

In our preferred embodiment, the existing atmospheres created and maintained within sub-chambers 37 and 39 comprise a predetermined combination of both reactive and non-reactive gas. The atmosphere created within sub-chamber 38 comprises a predetermined partial pressure of non-reactive gas only, said gas being elevated to a pressure above the pressure maintained within sub-chambers 37 and 39. The positive pressure differential thus created ensures that only a non-reactive gas atmosphere is maintained within sub-chamber 38. Gas migration through apertures 46 resulting from this pressure differential is continuously compensated for by the art known technique of differential pumping to maintain the created existing atmospheres within each sub-chamber.

As can readily be seen from the foregoing discussion and references to FIG. 3, each point on the lower surface of substrate 32, translating between the positions indicated by reference numerals 53 and 54, initially enters a first reactive sputtering region 47. The points then sequentially pass through a first overlap region 48, a non-reactive sputtering region 49, a second overlap region 50, and finally through a second reactive sputtering region 51 wherein is deposited upon substrate 32 the final layer of the laminate coating.

To more fully comply with the requirements set forth in 35 USC 112, the following specific example and data is provided relating to the practice of the method of our invention:

Rectangular plates of titanium are fabricated to serve as sputtering targets. Each target measures 72.0 in.×10.0 in.×0.5 in. and is secured by conventional means to the cathode of a planar magnetron such as that manufactured by the Industrial Vacuum Engineering Company of San Mateo, Calif. The magnetrons are generally operated at 500 V and 120 amps, utilizing circulatory water cooling at a rate sufficient to limit coolant exit temperature to not greater than 110° F.

The substrate consists of a coiled roll of polymeric sheet material 60.0 in. wide and 2 mils, thick mounted within the vacuum chamber essentially in the manner illustrated in FIG. 3. A suitable substrate is such as that manufactured by the Celanese Plastics Co. of Torrance, Calif. and identified as #5000 Celanar (a registered trademark) Polyester Film. In order to avoid excessive deformation of the polymeric web during the sputtering operation, the substrate is positioned so that the mean free path between the target and substrate surface is approximately 20 inches. Adjustable plates 45 are further positioned so that apertures 46 are approximately 4 inches wide.

Following the loading of the substrate, the vacuum chamber is sealed and the ambient atmosphere contained therein evacuated to approximately $5 \times 10^{-6}$ mmHg. This step is immediately followed by flushing the entire chamber with argon at a partial pressure of $1 \times 10^{-3}$ mmHg thereby to remove most residual wall gas impurities which could affect the quality and structure of the multi-layer coating. Atmospheres of argon at $5 \times 10^{-4}$ mmHg and oxygen at $3 \times 10^{-4}$ mmHg are then inroduced into sub-chambers 37 and 39, the regions wherein reactive sputtering is to occur. Simultaneously, an inert atmosphere of argon at $10 \times 10^{-4}$ mmHg is introduced into sub-chamber 38, the region of non-reactive sputtering. Inasmuch as a positive pressure differential is created between sub-chamber 38 and the adjacent sub-chambers, differential pumping is utilized to controllably maintain the existing atmospheres.

Electrical power is then applied to the planar magnetrons, and translation of the substrate, at approximately 7 meters/min., commenced.

At the conclusion of the operation, the coated substrate is removed from the chamber and it will be observed that the coating comprises a metal/metal-oxide laminate approximately 540 Angstroms thick, 200 Angstroms representing the thickness of the two transition layers. Testing of the coated article demonstrates that it is able to reflect approximately 85-95% of the heat producing wavelengths while transmitting approximately 70-85% of visible light.

The product hereinbefore described has been tested for corrosion resistance in accordance with the Federal Test Standard 151, Method 811-1. In this test the product was continuously exposed to a salt spray of 5% NaCl at 95°±2° F. for 96 hours. The tested sample exhibited no corrosion spots, pits, or breaks in the film coating at the conclusion of the test.

Of course, while the above example utilizes titanium, any material amenable to sputter deposition may be used. Thus, we have constructed laminates including, for example, copper, gold, silver, aluminum, nickel, chromium, molybdenum, vanadium, stainless steel, or a combination of these, as the metallic base. The selection of particular materials depends upon several factors including cost, desired phasing of refractive index, and desired final hue.

While the preferred embodiment of the invention has been shown and described herein, it is to be appreciated that various changes, rearrangements, and modifications may be made therein without departing from the scope of the invention as defined in the appended claims. For example, atmospheres may be individually created and maintained in the sub-chambers whereby are achieved permutations in refractive index phasing apart from that for the described embodiment. Further, it is not necessary for the practice of this invention that all planar magnetron cathodes comprise like target material. Dissimilar materials may be combined depending upon the contemplated use for a particular product. Therefore, to the extent such variant forms of my invention are possible, such variant forms are considered to be within the scope and essence of our invention.

What is claimed is:

1. A method for sputtering an inhomogeneous thin film laminate upon a transparent substrate which comprises the steps of:
   (a) positioning a substrate upon a holder within a vacuum chamber, said chamber defined by two or more essentially isolated sub-chambers;
   (b) adjusting apertures through which said substrate translates into adjacent sub-chambers whereby to form regions of overlap wherein said substrate simultaneously receives sputter deposition from magnetron cathodes contained within adjacent sub-chambers;
   (c) positioning at least one magnetron cathode within each of said sub-chambers, said cathodes comprising material to be sputter deposited;
   (d) evacuating said chamber to a predetermined low pressure;
   (e) flushing said evacuated chamber with non-reactive gas thereby to reduce wall gas impurities contained therein;
   (f) back filling each of said sub-chambers to predetermined pressures with non-reactive gas;
   (g) further introducing reactive gas into one or more of said sub-chambers whereby predetermined atmospheres are produced within each of said sub-chambers;
   (h) differentially pumping said gases through said sub-chambers whereby the predetermined atmospheres within each of said sub-chambers are maintained; and
   (i) sequentially translating said substrate at a constant rate of speed through each of said sub-chambers whereby an inhomogeneous coating of cathode material is deposited thereon.

2. The method according to claim 1 wherein said non-reactive gas is argon.

3. The method of claim 1 wherein said reactive gas is oxygen.

4. The method according to claim 1 wherein said substrate comprises a coil of transparent polymeric sheet material.

5. The method according to claim 1 wherein said substrate sequentially translates through predetermined atmospheres which comprise:
   (a) a first reactive sputtering region wherein metallic oxide is deposited upon said substrate;
   (b) a first overlap region wherein said substrate simultaneously receives sputter deposition from said first reactive region and a first non-reactive sputtering region;
   (c) a first non-reactive sputtering region wherein metal is deposited upon said substrate;
   (d) a second overlap region wherein said substrate simultaneously receives sputter deposition from said first non-reactive region and a second reactive sputtering region; and
   (e) a second reactive sputtering region wherein metallic oxide is deposited upon said substrate.

* * * * *